(12) United States Patent
Kontani et al.

(10) Patent No.: US 8,035,982 B2
(45) Date of Patent: Oct. 11, 2011

(54) POWER CONVERTER APPARATUS

(75) Inventors: Kazuyoshi Kontani, Aichi-ken (JP);
Toshinari Fukatsu, Aichi-ken (JP);
Toshiaki Nagase, Kariya (JP); Hiroyuki Onishi, Kariya (JP); Jun Ishikawa, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 366 days.

(21) Appl. No.: 12/397,820

(22) Filed: Mar. 4, 2009

(65) Prior Publication Data
US 2009/0257211 A1  Oct. 15, 2009

(30) Foreign Application Priority Data

Mar. 4, 2008  (JP) ................................. 2008-054047

(51) Int. Cl.
*H05K 7/00*  (2006.01)
(52) U.S. Cl. ........ 361/782; 361/783; 361/624; 361/637; 361/611
(58) Field of Classification Search .................. 361/622, 361/624, 632, 637, 639, 643, 648, 650, 760, 361/781–783, 773, 774, 278, 299.1–299.3, 361/298.2, 298.4, 306.1, 200, 738, 830
See application file for complete search history.

(56) References Cited

U.S. PATENT DOCUMENTS

| | | | |
|---|---|---|---|
| 2006/0232942 A1* | 10/2006 | Nakatsu et al. | 361/710 |
| 2006/0255448 A1 | 11/2006 | Nagase et al. | |
| 2007/0051974 A1* | 3/2007 | Azuma et al. | 257/177 |

FOREIGN PATENT DOCUMENTS

| | | |
|---|---|---|
| JP | 2002-044964 | 2/2002 |
| JP | 2003-009546 | 1/2003 |
| JP | 2004-214452 | 7/2004 |
| JP | 2005-167241 | 6/2005 |
| JP | 2005347561 A | 12/2005 |
| JP | 2006318953 A | 11/2006 |
| JP | 2007-143272 | 6/2007 |
| JP | 2009-213269 | 9/2009 |

* cited by examiner

*Primary Examiner* — Hoa C Nguyen
(74) *Attorney, Agent, or Firm* — Woodcock Washburn LLP

(57) ABSTRACT

A power converter apparatus that includes a substrate, plate-like positive and negative interconnection members, capacitors, and a cover is disclosed. Pairs of groups of switching elements are mounted on the substrate. The cover is arranged over the substrate to encompass the switching elements, the positive interconnection member, the negative interconnection member, and the capacitor. The positive interconnection member and the negative interconnection member each have a terminal portion that is joined to a circuit pattern on the substrate by ultrasonic bonding.

6 Claims, 9 Drawing Sheets

POWER CONVERTER APPARATUS

CROSS REFERENCE TO RELATED APPLICATION

This application claims priority to Japanese Application No. 2008-054047 filed Mar. 4, 2008.

BACKGROUND

The present invention relates to a power converter apparatus. In particular, the invention relates to a semiconductor device (power semiconductor module) having a semiconductor circuit that converts an alternating current to a direct current or to a power converter apparatus (inverter apparatus) having a capacitor module that forms a DC smoothing circuit in the power semiconductor module, where its interconnection inductance is required to be reduced.

Japanese Laid-Open Patent Publication No. 2006-318953 discloses a connection structure of terminals of semiconductor apparatus that reduces the inductance of a pair of interconnection members connected to a pair of electrode terminals of an external apparatus. The interconnection members of the above publication are shaped like plates, and arranged to be adjacent to face each other. The flowing directions of currents in the interconnection members are opposite to each other. The interconnection members are joined to the electrode terminals of the semiconductor apparatus to be connected to the interconnection members by ultrasonic bonding, resistance welding, or soldering. A pair of the electrode terminals of the external apparatus are exemplified by the positive terminal and the negative terminal of a capacitor.

Figure 11A:
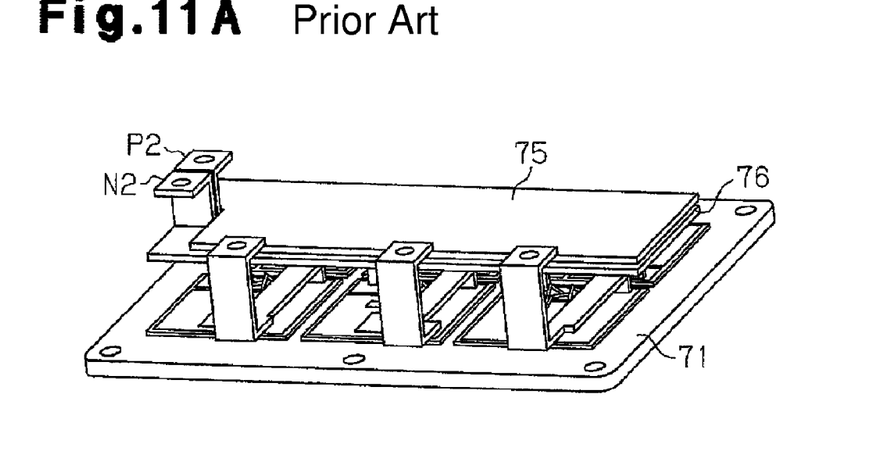
FIG. 11A is a perspective view illustrating a prior art power converter apparatus.
Figure 11B:
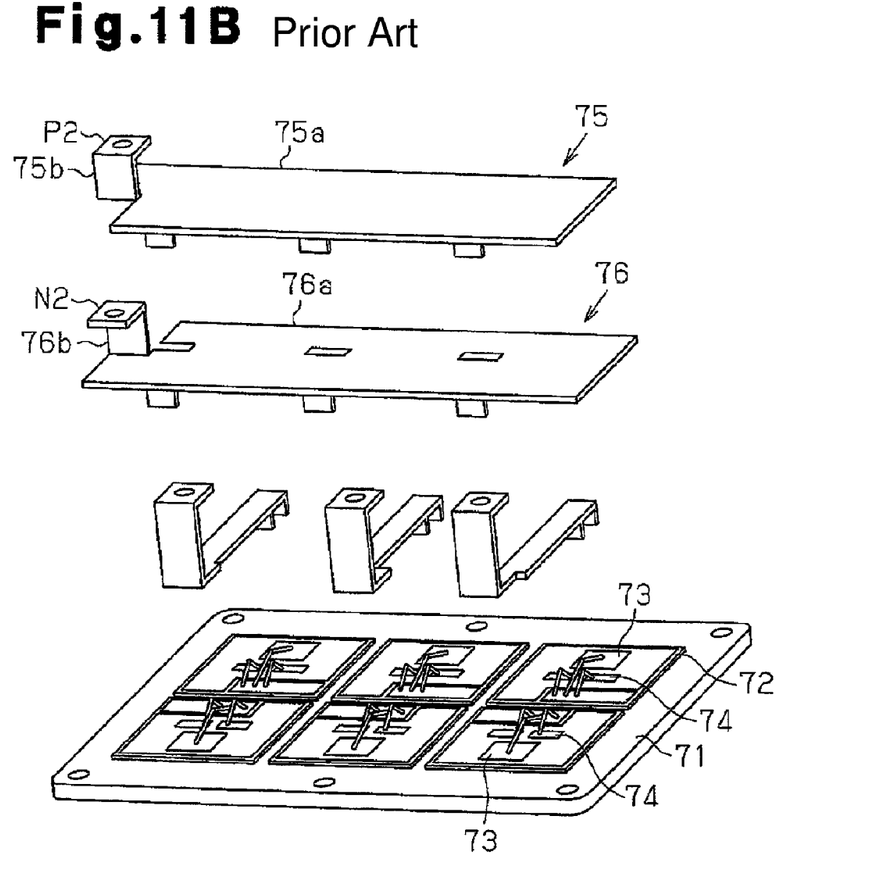
FIG. 11B is an exploded perspective view showing the power converter apparatus of FIG. 11A.

Japanese Laid-Open Patent Publication No. 2005-347561 discloses a structure and a configuration that reduce the inductance in each of the internal wiring of a power semiconductor module, the internal wiring of a capacitor module, and the external wiring from the capacitor module to the semiconductor module. Japanese Laid-Open Patent Publication No. 2005-347561 discloses a plurality of insulated substrates 72 provided on a base 71 as shown in FIGS. 11A and 11B. A switching chip 73 and a diode chip 74 are provided on each insulated substrate 72. A positive conductor 75 and a negative conductor 76 are laminated, while being insulated from each other, on the top surface of each of the switching chip 73 and the diode chip 74. An insulation case (not shown) is arranged over the base 71 to cover the insulated substrates 72, the switching chips 73, the diode chips 74, the positive conductor 75, and the negative conductor 76. The positive conductor 75 and the negative conductor 76 include flat plate-like main conductors 75a, 76a and belt-like sub-conductors 75b, 76b formed at ends of the main conductors 75a, 76a, respectively. The sub-conductor 75b of the positive conductor 75 and the sub-conductor 76b of the negative conductor 76 are adjacent to each other while being insulated from each other, and form external terminals P2, N2, respectively. Japanese Laid-Open Patent Publication No. 2005-347561 also discloses an inverter apparatus in which a capacitor module is located on an insulation case of the a power semiconductor module. The capacitor module includes a positive conductor and a negative conductor that are connected to a capacitor element. The positive and negative conductors are each formed by a plate-like main conductor and belt-like sub-conductors. The two plate-like main conductors are laminated together, while being insulated from each other. The belt-like sub-conductors are provided at ends of the main conductors and laminated together, while being insulated from each other. Ends of the sub-conductors form the external connecting terminals. Japanese Laid-Open Patent Publication No. 2005-347561 further discloses an inverter apparatus having branched conductors each provided in an upright state on one of the main conductors 75a and 76a of the positive conductor 75 and the negative conductor 76. Each branched conductor has a branched conductor connected to the capacitor element.

Although Japanese Laid-Open Patent Publication No. 2006-318953 discloses a semiconductor apparatus that reduces the interconnection inductance of the wiring between a capacitor and joint portions of the external terminals of a semiconductor module, the publication discloses no configuration for reducing the inductance of the interior of the semiconductor module. Further, Japanese Laid-Open Patent Publication No. 2006-318953 discloses no structure of a semiconductor apparatus in which a capacitor is accommodated in a case.

Japanese Laid-Open Patent Publication No. 2005-347561 discloses a configuration that reduces the inductance in each of the internal wiring of a power semiconductor module and the internal wiring of a capacitor module, and a configuration that reduces the inductance of external connecting terminals. Japanese Laid-Open Patent Publication No. 2005-347561 also discloses a configuration in which a capacitor module is accommodated in an insulation case of a power semiconductor module.

In the manufacturing process of the inverter apparatus of Japanese Laid-Open Patent Publication No. 2005-347561, in which a capacitor module is accommodated in an insulation case of a power semiconductor module, the terminals of an interconnection member need to be joined to wiring patterns of an insulated substrate with the capacitor mounted on the interconnection member. If the joint is achieved by soldering, the temperature is significantly increased in the vicinity of the capacitor. Accordingly, a special capacitor with enhanced heat resistance needs to be used. However, Japanese Laid-Open Patent Publication No. 2005-347561 has no disclosure regarding the need for such a special capacitor. Also, Japanese Laid-Open Patent Publication No. 2005-347561 has no disclosure whatsoever about whether the insulated substrate 72 is joined by soldering to the connecting conductors that connect the positive conductor 75 and the negative conductor 76 to the insulated substrate 72. However, since it is assumed that soldering is used from the shape of the illustrated connecting conductor, a special capacitor with enhanced heat resistance needs to be used.

SUMMARY

Accordingly, it is an objective of the present invention to provide a power converter apparatus that reduces interconnection inductance and eliminates the necessity for special capacitors with enhanced heat resistance.

To achieve the foregoing objective and in accordance with one aspect of the present invention, a power converter apparatus including a substrate, a plate-like positive interconnection member, a plate-like negative interconnection member, a capacitor, and a cover is provided. A plurality of switching elements are mounted on the substrate. The positive interconnection member and the negative interconnection member are arranged to be close to and parallel with each other and are arranged to be parallel with the substrate, while being electrically insulated from each other. The capacitor has a positive terminal electrically connected to the positive interconnection member and a negative terminal electrically connected to the negative interconnection member. The positive and negative terminals are located on the same side as the capacitor. The cover is arranged over the substrate to encompass the switching elements, the positive interconnection member, the negative interconnection member, and the capacitor. The positive interconnection member and the negative interconnection member each have one or more terminal portions that is joined to a circuit pattern on the substrate by ultrasonic bonding. The capacitor is arranged on one of the positive and negative interconnection members that does not directly face the substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof may best be understood by reference to the following description of the presently preferred embodiments together with the accompanying drawings in which.

DETAILED DESCRIPTION OF ILLUSTRATIVE EMBODIMENTS

A three-phase inverter apparatus 11 according to a first embodiment of the present invention will now be described with reference to FIGS. 1 to 9.

Figure 1A:
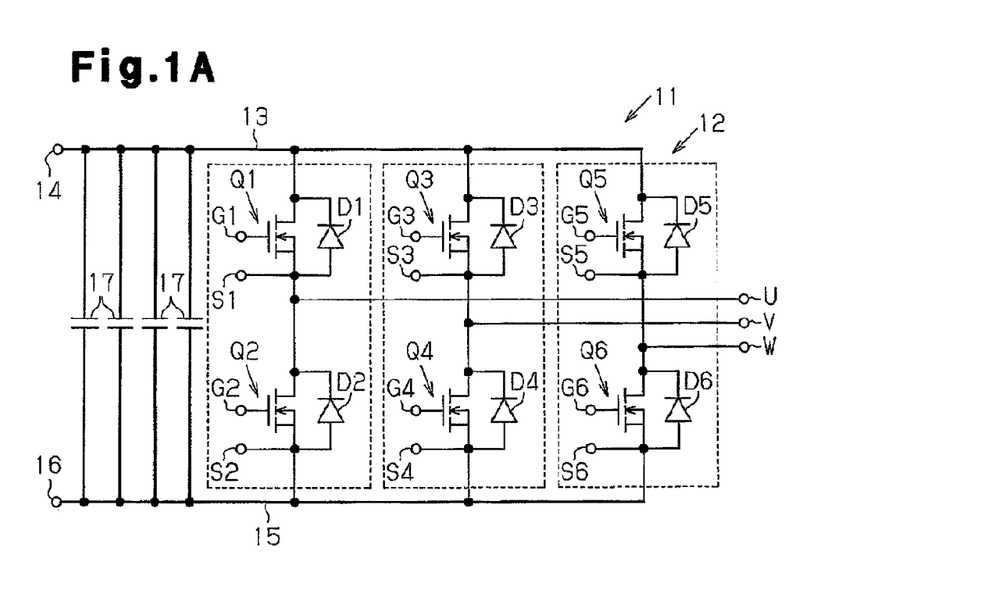
FIG. 1A is a circuit diagram showing an inverter apparatus, which is a power converter apparatus according to one embodiment of the present invention.

First, the circuit configuration of the inverter apparatus 11 will be described. As shown in FIG. 1A, the inverter apparatus 11 has an inverter circuit 12 with six switching elements Q1 to Q6. MOSFETs (metal-oxide-semiconductor field-effect transistors) are used as the switching elements Q1 to Q6. In each of the pair of the first and second switching elements Q1, Q2, the pair of the third and fourth switching elements Q3, Q4, and the pair of the fifth and sixth switching elements Q5, Q6, the switching elements are connected in series. Diodes D1 to D6 are connected in inverse parallel with a part between the drain and the source of the switching elements Q1 to Q6, respectively. The first, third, and fifth switching elements Q1, Q3, Q5 and the corresponding one of the diodes D1, D3, D5 connected thereto form a structure that is referred to as an upper arm. Also, each of the second, fourth, and sixth switching elements Q2, Q4, Q6 and the corresponding one of the diode D2, D4, D6 connected thereto form a structure that is referred to as a lower arm.

The drains of the switching elements Q1, Q3, Q5 are connected to a positive input terminal 14 for inputting power through a line 13, and the sources of the switching elements Q2, Q4, Q6 are connected to a negative input terminal 16 for inputting power through a line 15. A plurality of capacitors 17 are connected in parallel between the line 13 and the line 15. In the present embodiment, electrolytic capacitors are used as the capacitors 17. The positive terminals and the negative terminals of the capacitors 17 are connected to the line 13 and the line 15, respectively.

The node between the switching elements Q1, Q2 is connected to a U-phase terminal U, the node between the switching elements Q3, Q4 is connected to a V-phase terminal V, and the node between the switching elements Q5, Q6 is connected to a W-phase terminal W. The gates of the switching elements Q1 to Q6 are connected to drive signal input terminals G1 to G6, respectively. The sources of the switching elements Q1 to Q6 are connected to signal terminals S1 to S6, respectively.

Figure 1B:
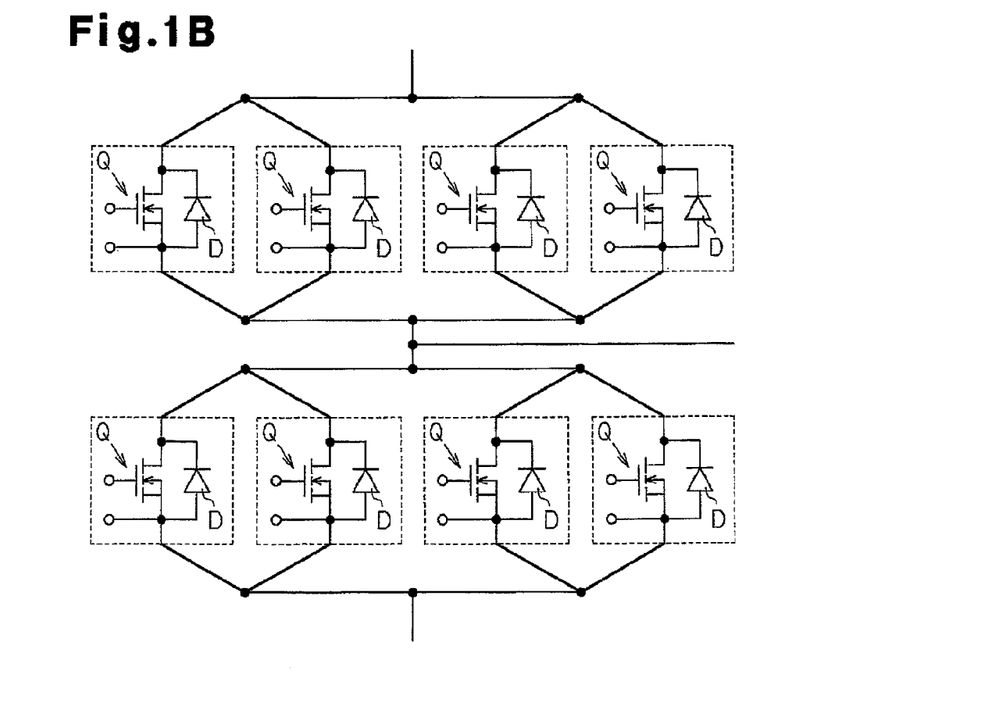
FIG. 1B is a circuit diagram showing a modification of the arms of the inverter apparatus shown in FIG. 1A.

In FIG. 1A, each of the upper arms and the lower arms includes one switching element and one diode. However, in a case where the amount of current through each arm is great, each arm may be configured with a plurality of parallel connected pairs of switching elements Q and diodes D as shown in FIG. 1B. In the present embodiment, each arm is formed by four pairs of a switching element Q and a diode D.

The structure of the inverter apparatus 11 will now be described.

Figure 2:
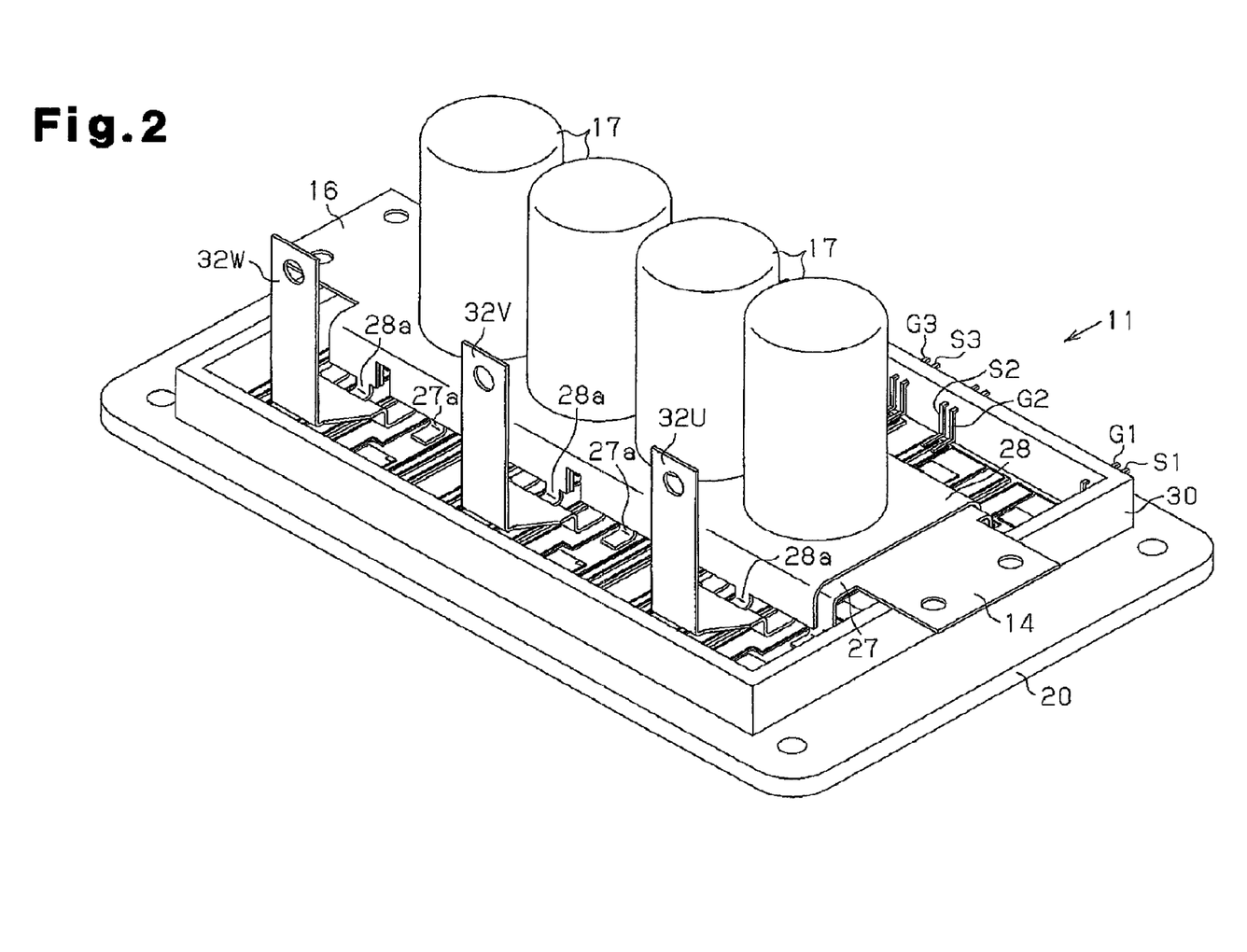
FIG. 2 is a schematic perspective view showing the inverter apparatus of FIG. 1A, from which the cover is omitted.
Figure 3:
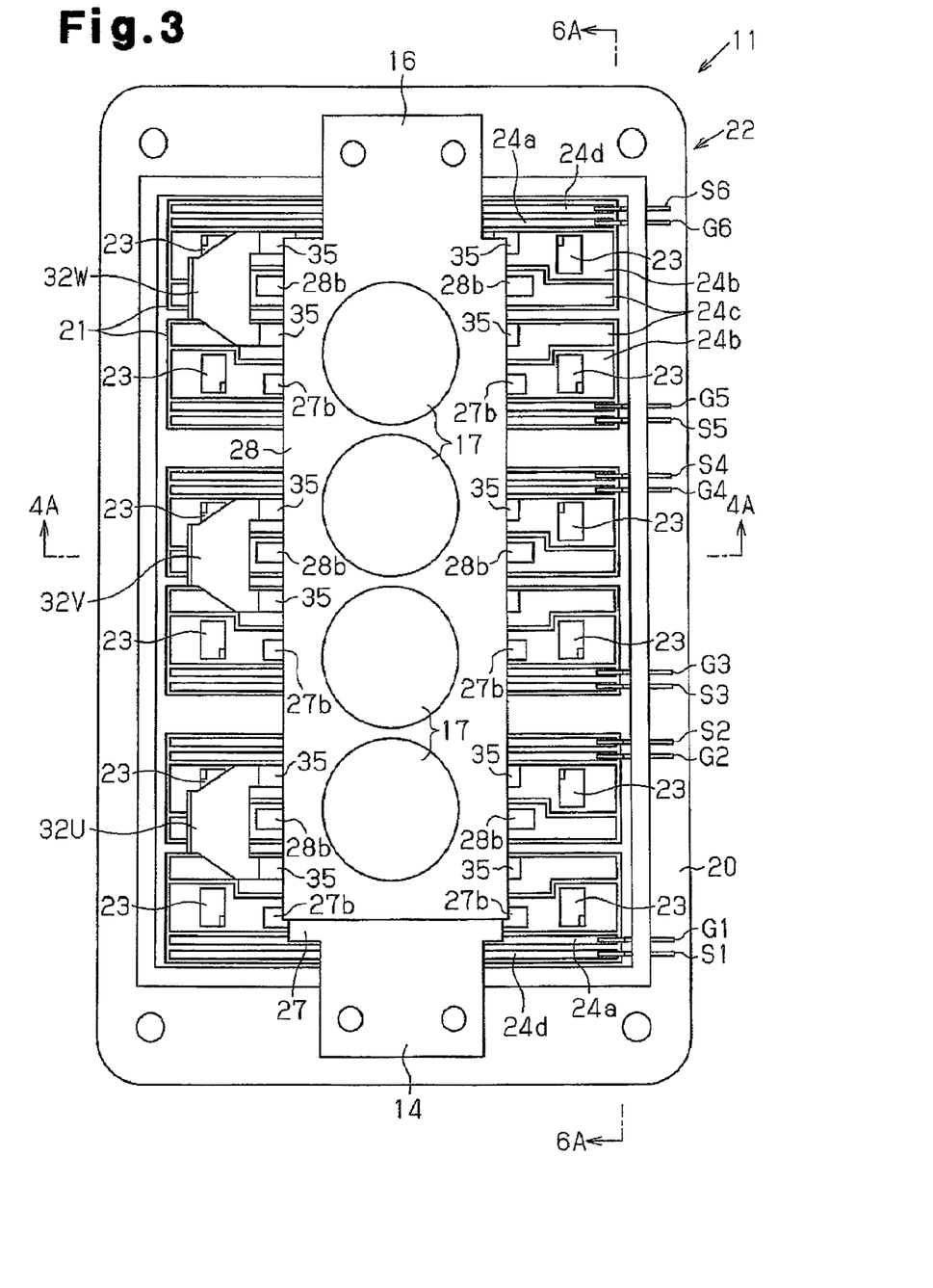
FIG. 3 is a plan view showing the inverter apparatus of FIG. 2.

As shown in FIGS. 2 and 3, the inverter apparatus 11 includes a substrate 22 formed by a metal baseplate 20 made of copper and ceramic substrates 21, which are insulated substrates. Semiconductor chips 23 are mounted on the substrate 22. Each semiconductor chip 23 incorporates one switching element (MOSFET) and one diode, which form a single device. That is, each semiconductor chip 23 corresponds to one of the devices provided with a single switching element Q and a single diode D shown in FIG. 1B. Since on the substrate 22, the signal terminals S1 to S6 and a control board (not shown) connected thereto are located on the side opposite to the U-phase terminal U, the V-phase terminal V, and the W-phase terminal W, the control board is hardly affected by principal currents through the U-phase terminal U, the V-phase terminal V, and the W-phase terminal W.

Figures 4A, 4B:
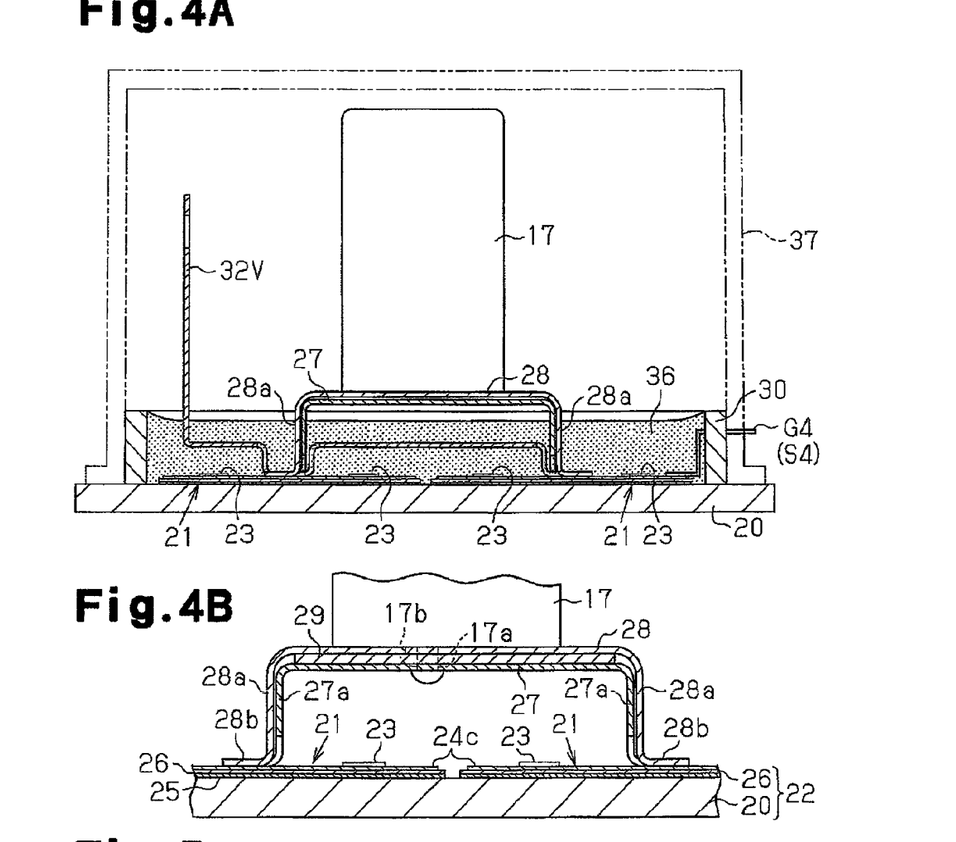
FIG. 4A is a cross-sectional view taken along line 4A-4A in FIG. 3.
FIG. 4B is a partially enlarged view of FIG. 4A, from which a part is omitted.
Figure 5:
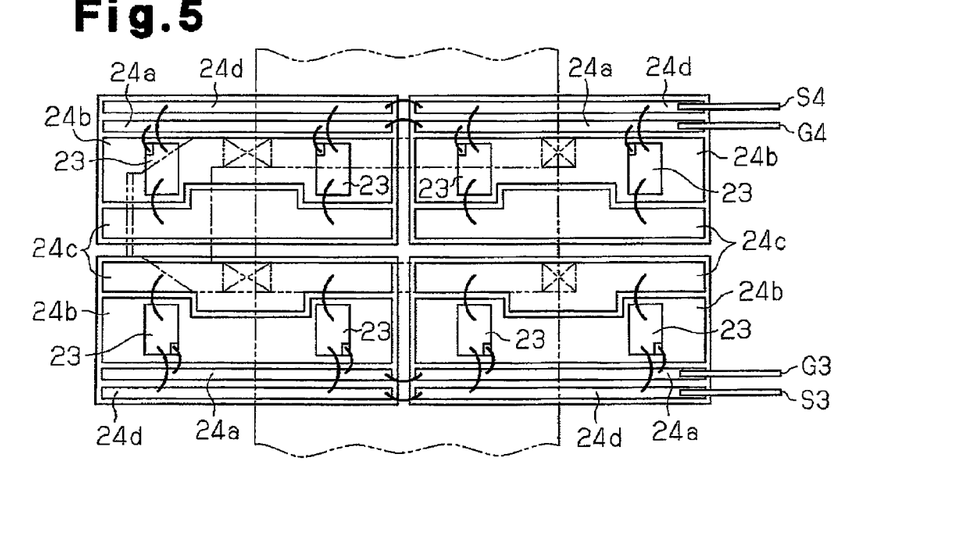
FIG. 5 is a partial plan view showing the connection state on the substrate of the inverter apparatus of FIG. 1A.

Each ceramic substrate 21 has a ceramic plate 26, which is formed of, for example, aluminum nitride, alumina, or silicon nitride. As shown in FIG. 5, circuit patterns 24a, 24b, 24c, 24d are formed on the upper surface of the ceramic plate 26. As shown in FIG. 4B, a metal plate 25 is provided on the lower surface of the ceramic plate 26. The circuit patterns 24a, 24b, 24c, 24d and the metal plate 25 are made of, for example, aluminum or copper. The metal plate 25 functions as a joining layer that joins the ceramic substrates 21 and the metal baseplate 20 with each other. The ceramic substrates 21 are joined to the metal baseplate 20 with the metal plates 25 in between using solder (not shown). In this description, the metal baseplate 20 is hereinafter referred to a bottom portion (lower portion) of the inverter apparatus 11.

As shown in FIG. 5, the circuit patterns 24a, 24b, 24c, and 24d are circuit patterns for gate signals, drains, sources, and source signals, respectively. Each of the circuit patterns 24a to 24d is formed like a belt. The drain circuit pattern 24b and the source circuit pattern 24c are adjacent to and parallel with each other. The gate signal circuit pattern 24a and the source signal circuit pattern 24d are located opposite to the circuit pattern 24c and parallel with the circuit pattern 24b. The semiconductor chips 23 joined to the drain circuit pattern 24b with solder. The gates of the semiconductor chips 23 and the gate signal circuit pattern 24a are electrically connected to each other by wire bonding. The sources of the semiconductor chips 23 are electrically connected to the source circuit patterns 24c and the source signal circuit patterns 24d by wire bonding.

Figure 7A:
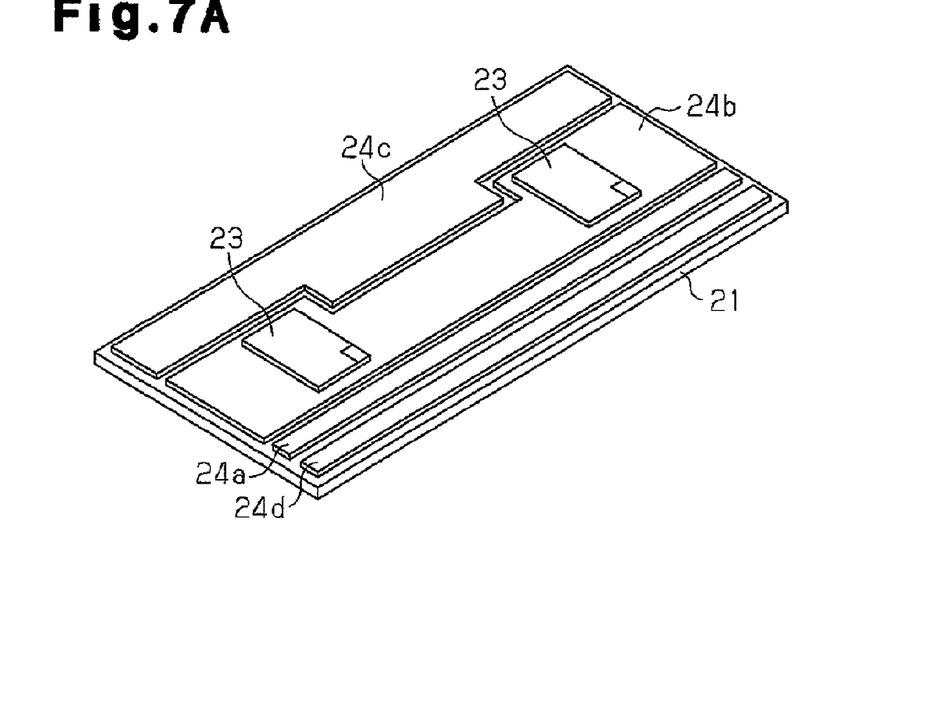
FIG. 7A is a schematic perspective view illustrating a ceramic substrate on which chip parts in the inverter apparatus of FIG. 1A are mounted.
Figure 7B:
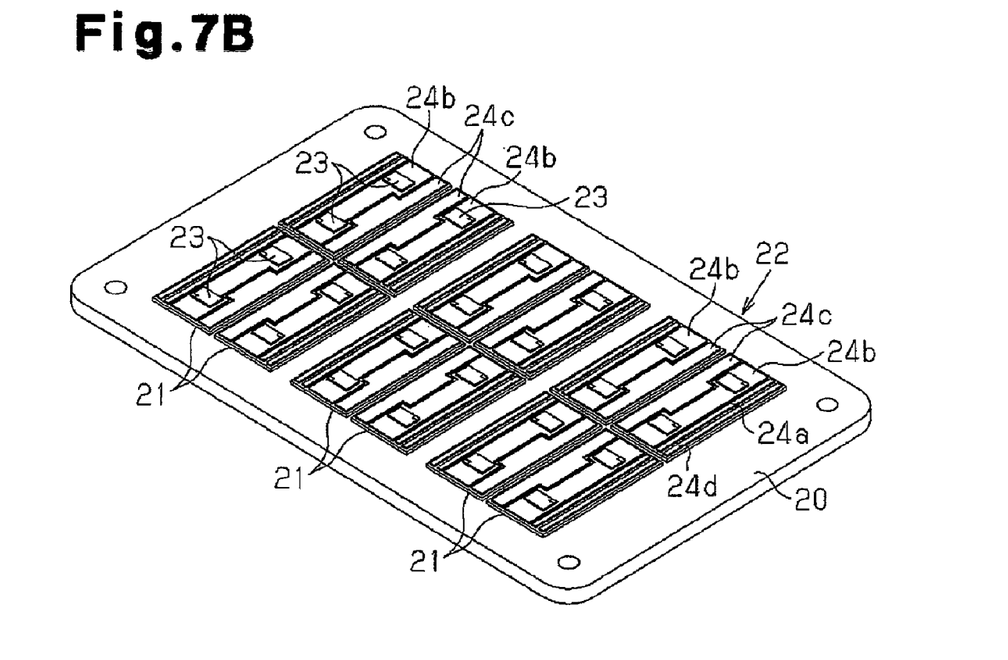
FIG. 7B is a schematic perspective view illustrating a metal baseplate on which the ceramic substrate of FIG. 7A is mounted.

As shown in FIG. 7B, the metal baseplate 20 and the ceramic substrates 21 are each substantially rectangular. Twelve ceramic substrates 21 are provided on the metal baseplate 20 and are arranged in six rows and two columns, such that the longitudinal direction of the ceramic substrates 21 is perpendicular to the longitudinal direction of the metal baseplate 20. The semiconductor chips 23 on two ceramic substrates 21 on each row form an arm of the inverter circuit 12. In the present embodiment, two semiconductor chips 23 are mounted on each ceramic substrate 21, and the four semiconductor chips 23 on the two ceramic substrate 21 in each row form one arm. As shown in FIG. 5, the two semiconductor chips 23 on each ceramic substrate 21 are arranged at ends in the longitudinal direction of the circuit pattern 24b, so that a space exists between the semiconductor chips 23.

A plate-like positive interconnection member 27 and a plate-like negative interconnection member 28 are located on the substrate 22 while being stacked and close to each other. Specifically, the positive interconnection member 27 and the negative interconnection member 28 are parallel with the substrate 22 and insulated from each other. In the present embodiment, the negative interconnection member 28 is located above the positive interconnection member 27. The positive interconnection member 27 forms the line 13, and the negative interconnection member 28 forms the line 15. The positive interconnection member 27 has a plurality of (three pairs of, that is, six in the present embodiment) terminal portions 27a that extend from ends of the positive interconnection member 27 toward the substrate 22. At is distal end, each terminal portion 27a is joined by ultrasonic bonding to a center of the drain circuit pattern 24b on the ceramic substrate 21 having the semiconductor chip 23 forming an upper arm. The negative interconnection member 28 has a plurality of (three pairs of, that is, six in the present embodiment) terminal portions 28a that extend from ends of the negative interconnection member 28 toward the substrate 22. Each terminal portion 28a is joined by ultrasonic bonding to a center of the source circuit pattern 24c on the ceramic substrate 21 having the semiconductor chip 23 forming a lower arm.

More specifically, the terminal portions 27a, 28a are located on both ends of the positive interconnection member 27 and the negative interconnection member 28 in the widthwise direction as shown, for example, in FIG. 4B, so as to be symmetric with respect to a line extending along the center in the widthwise direction. The terminal portions 27a, 28a are bent from the ends in the widthwise direction of the positive interconnection member 27 and the negative interconnection member 28 toward the substrate 22, and are further bent to extend parallel with the substrate 22. The distal portions of the terminal portions 27a, 28a, which extend parallel with the substrate 22, form joint portions 27b, 28b to be joined to the substrate 22, and the joint portions 27b, 28b are joined by ultrasonic bonding to the substrate 22 at the joint portions 27b, 28b. The joint portions, which are on the same side of the interconnection members 27, 28 in the widthwise direction, that is, joint portions between the terminal portions 27a, 28a and the circuit patterns 24b, 24c that are joined by ultrasonic bonding are located on a single straight line.

Figure 6A:
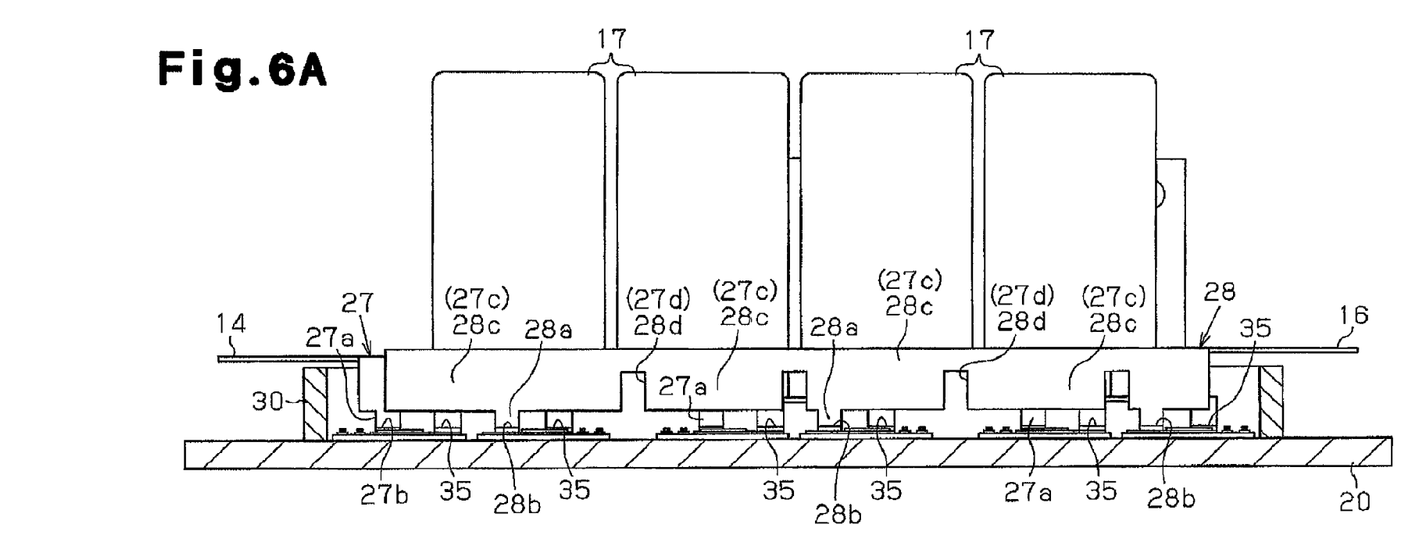
FIG. 6A is a cross-sectional view taken along line 6A-6A in FIG. 3.
Figure 6B:
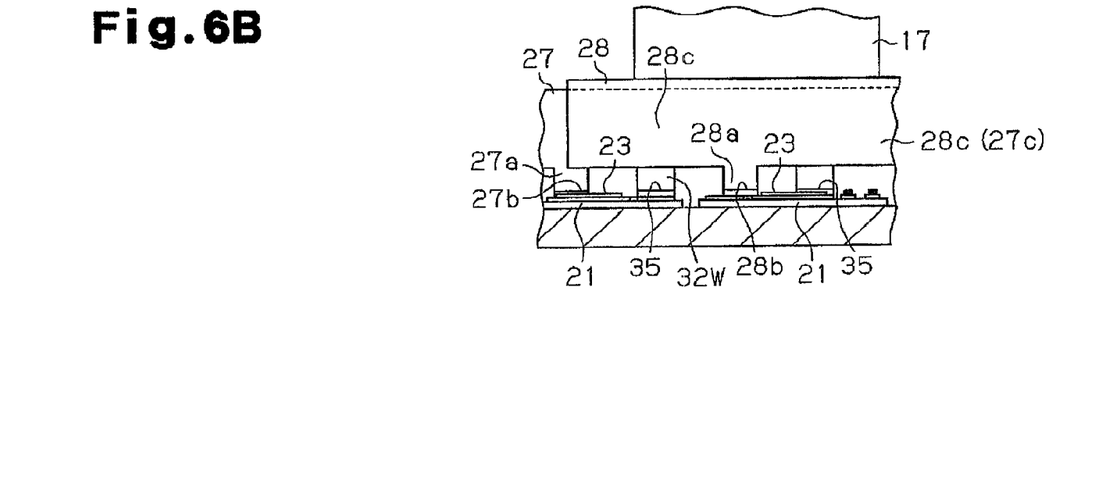
FIG. 6B is a partially enlarged view of FIG. 6A.

As shown in FIGS. 6A and 6B, the positive interconnection member 27 and the negative interconnection member 28 have downward extensions 27c, 28c, respectively. The downward extensions 27c, 28c are located on the widthwise ends of the positive interconnection member 27 and the negative interconnection member 28, and formed continuously with the joint portions 27b, 28b of the terminal portions 27a, 28a. The downward extensions 27c, 28c are arranged to overlap each other. The downward extensions 27c, 28c have a plurality of notches 27d, 28d along the entire length of the positive interconnection member 27 and the negative interconnection member 28, respectively. An insulation member 29 is located between the positive interconnection member 27 and the negative interconnection member 28. The insulation member 29 electrically insulates the positive interconnection member 27 and the negative interconnection member 28 from each other. The positive interconnection member 27, the negative interconnection member 28, and the insulation member 29 have elongated holes into which a positive terminal 17a and a negative terminal 17b of a capacitor 17 can be inserted.

A support frame 30 made of electrical insulation material is fixed to the metal baseplate 20 to extend along the edge of the metal baseplate 20. All the ceramic substrates 21 are accommodated in the support frame 30. The positive input terminal 14 for receiving outer power is formed at a longitudinal end of the positive interconnection member 27. The positive input terminal 14 extends to the outside of the support frame 30. The negative input terminal 16 is formed at a longitudinal end of the negative interconnection member 28, specifically, the end opposite to the positive input terminal 14. The negative input terminal 16 extends to the outside of the support frame 30.

The capacitors 17 are arranged on one of the positive interconnection member 27 and the negative interconnection member 28 that does not directly face the substrate 22, that is, on the negative interconnection member 28. In the present embodiment, four capacitors 17 are arranged on the negative interconnection member 28 with electrical insulation member (not shown) in between, such that the positive terminals 17a and the negative terminals 17b face the substrate 22. The positive terminal 17a and the negative terminal 17b of each capacitor 17 are located on one side of the capacitor main body. The positive terminal 17a is connected to the positive interconnection member 27, and the negative terminal 17b is connected to the negative interconnection member 28.

As shown in FIGS. 2 and 3, three output electrode members 32U, 32V, 32W of the inverter apparatus 11 each have a portion that extends upward and a portion that extends laterally, so as to be shaped like L as viewed from the side. The upward extending portion is located close to the support frame 30, and the laterally extending portion extends perpendicular to the longitudinal direction of the positive interconnection member 27 below the positive interconnection member 27. The insulation between the positive interconnection member 27 and the output electrode members 32U, 32V, 32W is ensured by silicone gel 36 (shown in FIG. 4A). The output electrode member 32U is joined by ultrasonic bonding to the source circuit pattern 24c of the upper arm formed by the first switching element Q1 and the diode D1, and to the drain circuit pattern 24b of the lower arm formed by the second switching element Q2 and the diode D2. The output electrode member 32V is joined by ultrasonic bonding to the source circuit pattern 24c of the upper arm formed by the third switching element Q3 and the diode D3, and to the drain circuit pattern 24b of the lower arm formed by the fourth switching element Q4 and the diode D4. The output electrode member 32W is joined by ultrasonic bonding to the source circuit pattern 24c of the upper arm formed by the fifth switching element Q5 and the diode D5, and to the drain circuit pattern 24b of the lower arm formed by the sixth switching element Q6 and the diode D6.

The output electrode members 32U, 32V, 32W are each formed by pressing a copper plate the width of which is substantially equal to the width of the ceramic substrates 21. As shown, for example, in FIG. 8B, each of the output electrode members 32U, 32V, 32W has four joint portions 35. Two of the joint portions 35 are joined to substantially centers of the circuit patterns 24b of the two ceramic substrate 21 having the semiconductor chips 23 that form the upper arm. The other two are joined to substantially centers of the circuit patterns 24c of the two ceramic substrate 21 having the semiconductor chips 23 that form the lower arm.

Each of the substantially L-shaped output electrode members 32U, 32V, 32W has a horizontal portion, which has a pair of the joint portions 35 at the proximal end (a part closer to the bent portion), and another pair of the joint portions 35 at the distal end. The joint portions 35 extend toward the substrate 22 from the horizontal portion. A space capable of receiving the terminal portion 28a and the joint portions 28b of the negative interconnection member 28 is defined between the joint portions 35 at the proximal side and between the joint portions 35 at the distal side. As shown in FIG. 3, the pairs of the joint portions 35 and the joint portions 27b, 28b on each of the widthwise sides of the positive and negative interconnection members 27, 28 are arranged on a single line.

Of the two ceramic substrates 21 corresponding to each arm, the gate signal circuit patterns 24a and the source signal circuit patterns 24d of the ceramic substrate 21 located at the distal end of the horizontal portion of the output electrode members 32U, 32V, 32W are connected to the drive signal input terminals G1 to G6 and the signal terminals S1 to S6, respectively. Since the signal terminals S1 to S6 are joined by ultrasonic bonding to the ceramic substrates 21, the signal terminals S1 to S6 can be made more compact compared to the case where the signal terminals S1 to S6 are joined by wire bonding to the ceramic substrates 21. The terminals G1 to G6 and S1 to S6 are integrally molded with the support frame 30 so as to extend through the support frame 30, so that second ends project from the support frame 30. The circuit patterns 24a formed on the two ceramic substrates 21 of each arm are electrically connected to each other by wire bonding. Also, the circuit patterns 24d formed on the two ceramic substrates 21 of each arm are electrically connected to each other by wire bonding.

The support frame 30 is filled with the silicone gel 36, which is then cured to insulate and protect the semiconductor chips 23. A cover 37 may be fixed to the metal baseplate 20 with bolts to cover the surface of the substrate 22 on which the semiconductor chips 23, or the switching elements Q1 to Q6 are mounted, the positive interconnection member 27, the negative interconnection member 28, the capacitors 17, the output electrode members 32U, 32V, 32W, the support frame 30.

A method for manufacturing the inverter apparatus 11, which is constructed as above, will hereafter be described.

First, a step for mounting the semiconductor chips 23 on the ceramic substrates 21 will be described. In this step, as shown in FIG. 7A, two semiconductor chips 23 are joined by soldering to the drain circuit pattern 24b on a ceramic substrate 21 such that a space exists in a center in the longitudinal direction. The gate of each semiconductor chip 23 and the gate signal circuit pattern 24a are connected to each other by wire bonding, the source of each semiconductor chip 23 and the source circuit pattern 24c are connected to each other by wire bonding, and the source of each semiconductor chip 23 and the source signal circuit pattern 24d are connected to each other by wire bonding.

Next, a step for joining ceramic substrate 21 to the metal baseplate 20 will be described. In this step, as shown in FIG. 7B, the ceramic substrates 21 on which the semiconductor chips 23 are mounted are joined by soldering to the metal baseplate 20 in six rows and two columns. The circuit pattern 24a and the circuit pattern 24d of each ceramic substrates 21 having the same arm are electrically connected by wire bonding to the circuit pattern 24a and the circuit pattern 24d of another ceramic substrate 21 having the arms, respectively.

Figure 8A:
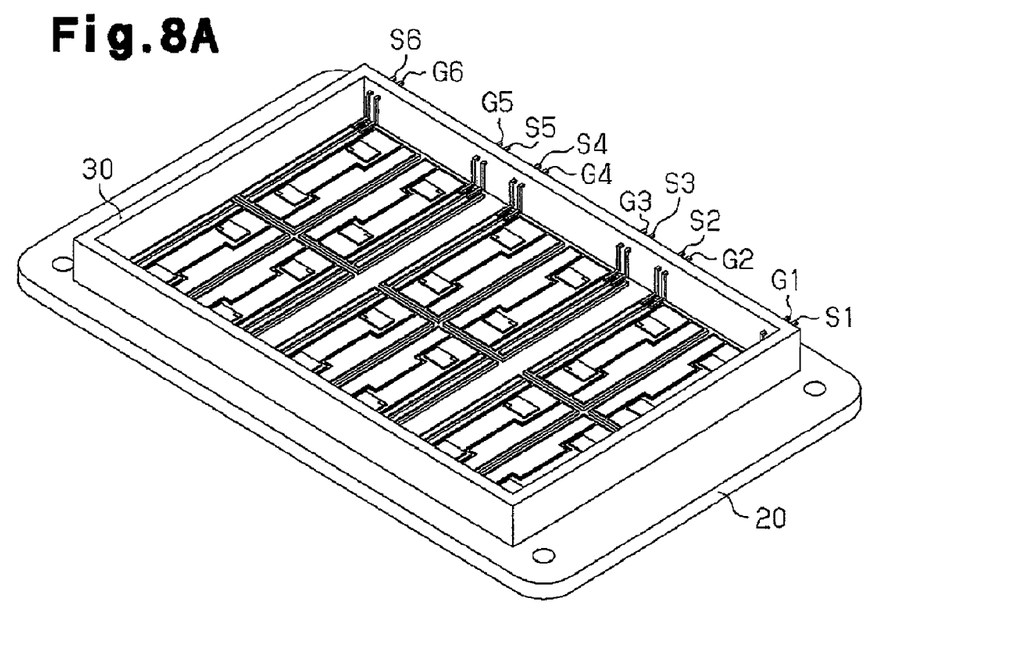
FIG. 8A is a schematic perspective view showing a state in which a support frame is attached to the metal baseplate of FIG. 7B.
Figure 8B:
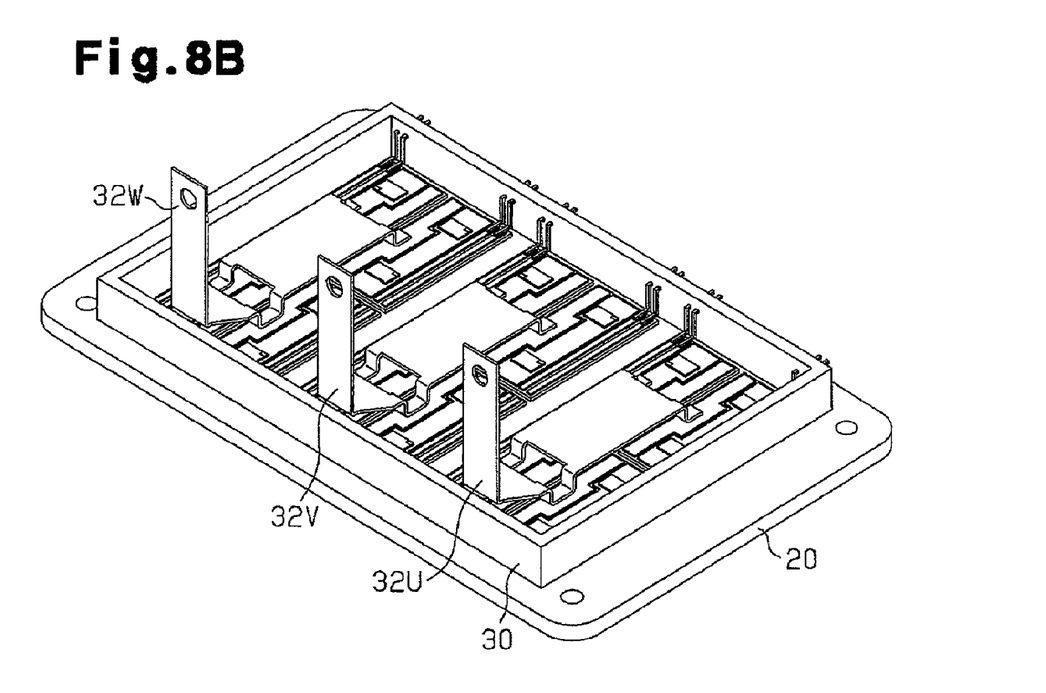
FIG. 8B is a schematic perspective view showing a state in which output electrode members are attached to the metal baseplate of FIG. 7A.

Next, a step for joining output electrode members 32U, 32V, 32W to the ceramic substrates 21 will be described. In this step, as shown in FIG. 8A, a support frame 30 having drive signal input terminals G1 to G6 and signal terminals S1 to S6 is fixed to the metal baseplate 20 so as to encompass the ceramic substrates 21. The support frame 30 is fixed by means of adhesive or screws. Then, as shown in FIG. 8B, the output electrode members 32U, 32V, 32W are arranged such that each joint portion 35 contacts a substantially center of one of the drain circuit pattern 24b and the source circuit pattern 24c. Subsequently, the joint portions 35 are successively joined by ultrasonic bonding to the circuit patterns 24b and the circuit patterns 24c. Also, the first ends of the drive signal input terminals G1 to G6 are joined to the circuit patterns 24a by ultrasonic bonding, and the first ends of the signal terminals S1 to S6 are joined to the circuit patterns 24d by ultrasonic bonding.

Then, a step for assembling a capacitor assembly 38 is performed. In this step, four capacitors 17 are fixed along a single line at predetermined intervals using a jig, such that the positive terminals 17a and the negative terminals 17b face upward. Then, a negative interconnection member 28 is fixed to the negative terminals 17b of the capacitors 17 with insulating material in between. Subsequently, a positive interconnection member 27 is fixed to the positive terminals 17a of the capacitors 17 while placing an insulation member 29 between the positive interconnection member 27 and the negative interconnection member 28. In this manner, the capacitor assembly 38 is assembled such that the positive interconnection member 27 and the negative interconnection member 28 are insulated from each other, and that the positive interconnection member 27 and the negative interconnection member 28 are electrically connected to the positive terminals 17a and the negative terminals 17b of the capacitors 17, respectively.

Figure 9:
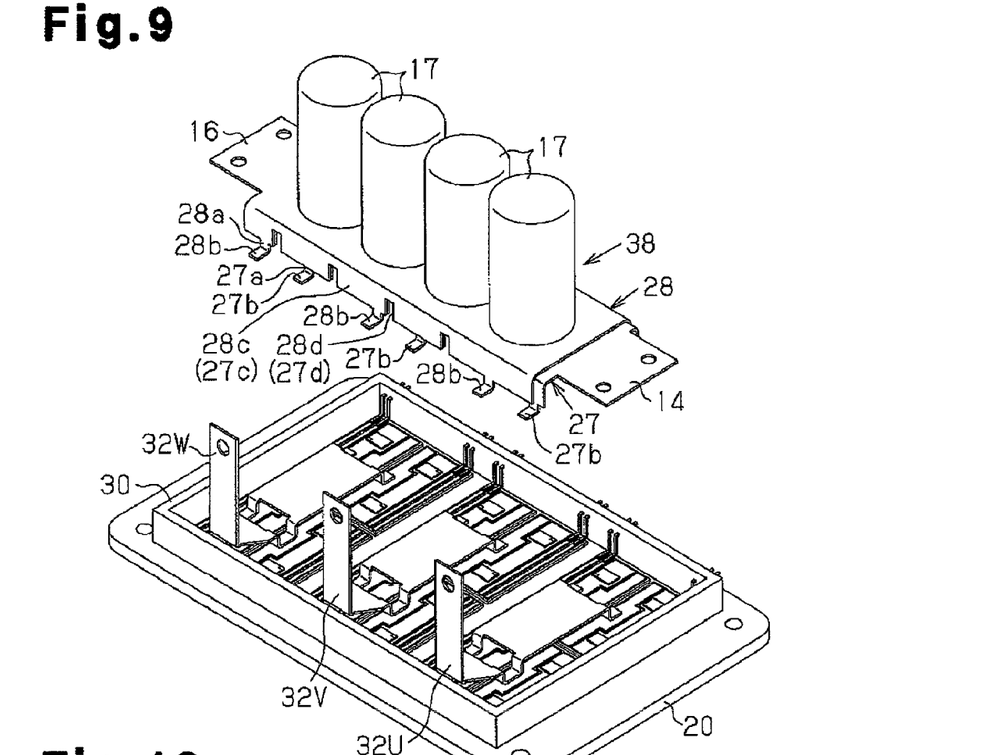
FIG. 9 is a schematic perspective view showing the relationship among the capacitor assembly, the metal baseplate, the support frame, and the output electrode members in the inverter apparatus of FIG. 2.

Next, a step for joining by ultrasonic bonding the capacitor assembly 38 to the ceramic substrates 21 will be described. In this step, the capacitor assembly 38 is first placed on the ceramic substrates 21. As shown in FIG. 9, the capacitor assembly 38 is arranged at a predetermined position in the support frame 30 from above the ceramic substrates 21. At this time, as shown in FIG. 3, the joint portions 27b, 28b on the same side of the interconnection members 27, 28 in the widthwise direction are located on a single line.

Thereafter, the terminal portions 27a, 28a are successively joined to the circuit patterns 24b, 24c at the joint portions 27b, 28b by ultrasonic bonding. The joint portions 27b, 28b are close to the capacitors 17. Thus, if general capacitors in which the heat resistance is not particularly considered are used as the capacitors 17, and soldering is used to join the terminal portions 27a, 28a, the heat accompanying the soldering can adversely affect the capacitors 17. However, since the terminal portions 27a, 28a and the circuit patterns 24b, 24c are joined by ultrasonic bonding, the amount of heat applied to the capacitors 17 is less than the case where soldering is performed. Thus, special capacitors with enhanced heat resistance are not required.

To electrically insulate and protect portions that should be kept away from moisture and oxidation, for example, the semiconductor chips 23 and joint portions, the support frame 30 is filled with silicone gel 36, which is then cured. The downward extensions 27c, 28c of the positive interconnection member 27 and the negative interconnection member 28 have notches 27d, 28d, respectively. Compared to the case where no notches 27d, 28d are provided, the silicone gel 36 easily flows into the space between the positive interconnection member 27 and the negative interconnection member 28. Consequently, the cover 37 is fixed to the metal baseplate 20 with bolts, so that the inverter apparatus 11 is completed.

Functions of the inverter apparatus 11 having the above construction will now be described.

The inverter apparatus 11 is, for example, a part of the power supply unit of a vehicle. In the inverter apparatus 11, the positive input terminal 14 and the negative input terminal 16 are connected to a DC power source (not shown), and the U-phase terminal U, the V-phase terminal V, and the W-phase terminal W are connected to a motor (not shown). The drive signal input terminals G1 to G6 and the signal terminals S1 to S6 are connected to a control unit (not shown).

The switching elements Q1, Q3, Q5 of the upper arm and the switching elements Q2, Q4, Q6 of the lower arm are each subjected to ON-OFF control at predetermined intervals, so that the motor is driven on AC.

At switching of the switching elements Q1 to Q6, a current that abruptly rises or a current that abruptly falls flows through the positive interconnection member 27 and the negative interconnection member 28. The flowing directions of the current in the positive interconnection member 27 and the negative interconnection member 28 are opposite to each other. Since the positive interconnection member 27 and the negative interconnection member 28 are parallel and close to each other, the inductance of the wiring is reduced by the effect of mutual inductance. Also, the downward extensions 27c, 28c are arranged to be parallel with and close to each other. This further reduces the interconnection inductance.

The above illustrated embodiment has the following advantages.

(1) The inverter apparatus 11 includes the substrate 22, on which a plurality of switching elements are mounted, the plate-like positive and negative interconnection members 27, 28, the capacitors 17 arranged on the negative interconnection member 28, and the cover 37. The positive interconnection member 27 and the negative interconnection member 28 are arranged in a stacked state to be parallel with the substrate, while being insulated from each other. The negative interconnection member 28 is arranged on the side where it does not directly face the substrate 22. The positive terminal 17a and the negative terminal 17b of each capacitor 17 are located on one side of the capacitor main body that faces the negative interconnection member 28. The positive terminal 17a is electrically connected to the positive interconnection member 27, and the negative terminal 17b is electrically connected to the negative interconnection member 28. The terminal portions 27a, 28a of the positive and negative interconnection members 27, 28 are joined to the circuit patterns 24b, 24c of the substrate 22 by ultrasonic bonding. The cover 37 is arranged over the substrate 22 to encompass the switching elements, the positive interconnection member 27, the negative interconnection member 28, and the capacitors 17. The length of the current path between each capacitor 17 and the semiconductor chips 23 is less than the length of the current path between the capacitor 17 and the semiconductor chip 23 in the case where the capacitor 17 is located outside of the cover 37. This reduces the interconnection inductance at the time of activating the inverter apparatus 11.

(2) The positive interconnection member 27 and the negative interconnection member 28 are joined to the capacitors 17, and thereafter the joint portions 27b, 28b of the terminal portions 27a, 28a of the positive interconnection member 27 and the negative interconnection member 28 are joined to the circuit patterns 24b, 24c by ultrasonic bonding. Thus, unlike the case where the joint portions 27b, 28b are joined by soldering to the circuit patterns 24b, 24c of the substrate 22, no special capacitors with enhanced heat resistance are required.

(3) The capacitors 17 are arranged on one of the positive interconnection member 27 and the negative interconnection member 28 that is does not directly face the substrate 22, that is, on the negative interconnection member 28. The positive terminal 17a is connected to the positive interconnection member 27, and the negative interconnection member 28 is connected to the negative terminal 17b. Thus, the positive terminal 17a and the negative terminal 17b are closer to the substrate 22 than the capacitor main body. Therefore, the distance between the switching elements (semiconductor chips 23) mounted on the substrate 22 and the positive and negative terminals 17a, 17b of each capacitor 17 is less than that in a case where the positive terminal 17a and the negative terminal 17b are arranged in a part of the capacitor main body that does not directly face the substrate 22 (a part that does not face the negative interconnection member 28). Thus, the interconnection inductance is further reduced.

(4) The terminal portions 27a, 28a of the positive and negative interconnection members 27, 28 are bent toward the substrate 22 from both ends of the positive and negative interconnection members 27, 28 in the widthwise direction. Further, the joint portions 27b, 28b formed at the distal ends are bent to be parallel with the interconnection members 27, 28. The joint portions 27b, 28b are joined to the substrate 22 by ultrasonic bonding. The joint portions 27b, 28b on the same side of the interconnection members 27, 28 in the widthwise direction are located on a single line. Therefore, when joining the joint portions 27b, 28b to the substrate 22 by ultrasonic bonding, a tool for ultrasonic bonding (horn) is moved on a single straight line along the interconnection members 27, 28, such that a pressing portion of the tool faces the joint portions 27b, 28b of the terminal portions 27a, 28a. The ultrasonic bonding is therefore efficiently performed.

(5) The four joint portions 35 of each of the output electrode members 32U, 32V, 32W are located at the four corners of an imaginary rectangle. Therefore, when joining the output electrode members 32U, 32V, 32W to the ceramic substrates 21 by ultrasonic bonding, the output electrode members 32U, 32V, 32W are stably placed on the ceramic substrates 21 in an upright state. Thus, ultrasonic bonding can be performed without using a jig to holding the output electrode members 32U, 32V, 32W.

The present invention is not limited to the embodiments described above, but may be embodied as follows, for example.

The steps for manufacturing the inverter apparatus 11 do not need to be performed in the order described in the above embodiment. For example, the step for mounting the semiconductor chips 23 on the ceramic substrate 21 and the step for assembling the capacitor assembly 38 may be independently executed, so that a number of ceramic substrates 21 on which semiconductor chips 23 are mounted and a number of capacitor assemblies 38 are manufactured. Thereafter, combining these components, inverter apparatuses 11 are manufactured.

The step for joining the output electrode members 32U, 32V, 32W to the ceramic substrates 21 by ultrasonic bonding and the step for joining the capacitor assembly 38 to the ceramic substrates 21 by ultrasonic bonding may be integrated. For example, the support frame 30 has holding portions that hold the output electrode members 32U, 32V, 32W in a state where the positions thereof have been determined. The output electrode members 32U, 32V, 32W do not need to be joined to the ceramic substrates 21 by ultrasonic bonding immediately after determining the positions of the output electrode members 32U, 32V, 32W relative to the ceramic substrates 21 while holding the output electrode members 32U, 32V, 32W using the holding portions. Instead of joining the output electrode members 32U, 32V, 32W to the ceramic substrates 21 by ultrasonic bonding immediately after fixing the output electrode members 32U, 32V, 32W to the ceramic substrates 21 in a state where the output electrode members 32U, 32V, 32W are held against the support frame 30 by the holding portions, the output electrode members 32U, 32V, 32W may be joined to the ceramic substrates 21 by ultrasonic bonding at the same time as the capacitor assembly 38 is joined to the ceramic substrates 21 by ultrasonic bonding. Since the joint portions 35 of the output electrode members 32U, 32V, 32W are located on the same line as the joint portions 27b, 28b of the positive interconnection member 27 and the negative interconnection member 28. Therefore, by moving a tool for ultrasonic bonding (horn) along the interconnection members 27, 28, the tool sequentially faces each of the joint portions 27b, 28b, 35. The ultrasonic bonding is thus efficiently performed.

In the case where the ultrasonic bonding of the output electrode members 32U, 32V, 32W to the ceramic substrates 21 is performed prior to the ultrasonic bonding of the capacitor assembly 38 to the ceramic substrates 21, the joint portions 35 of the output electrode members 32U, 32V, 32W and the joint portions 27b, 28b of the positive interconnection member 27 and the negative interconnection member 28 do not need to be arranged on a single line.

Ultrasonic bonding does not need to be performed at one point (joint) at a time, but may be performed at two or more points at a time. In this case, compared to the ultrasonic bonding performed at one point at a time, the time required for completing the ultrasonic bonding for all the points to be joined is shortened. Particularly, in the case where two points are joined at a time, the ultrasonic bonding can be performed without significantly increasing the size of the ultrasonic bonding tool. Also, since the number of the points to be joined is an even number, the ultrasonic bonding performed efficiently.

As long as the positive interconnection member 27 and the negative interconnection member 28 are arranged in a stacked state to be parallel with the substrate 22, while being insulated from each other, the negative interconnection member 28 may be located above the positive interconnection member 27. That is, the negative interconnection member 28 does not need to be located on an interconnection member that directly face the substrate 22. The positive interconnection member 27 may be arranged above the negative interconnection member 28, or at a side where it does not directly face the substrate 22. However, when electrolytic capacitors are used as the capacitors 17, the negative interconnection member 28 is preferably arranged above the positive interconnection member 27 since the grounds of the electrolytic capacitors are located outside of the electrolytic capacitors.

Figure 10:
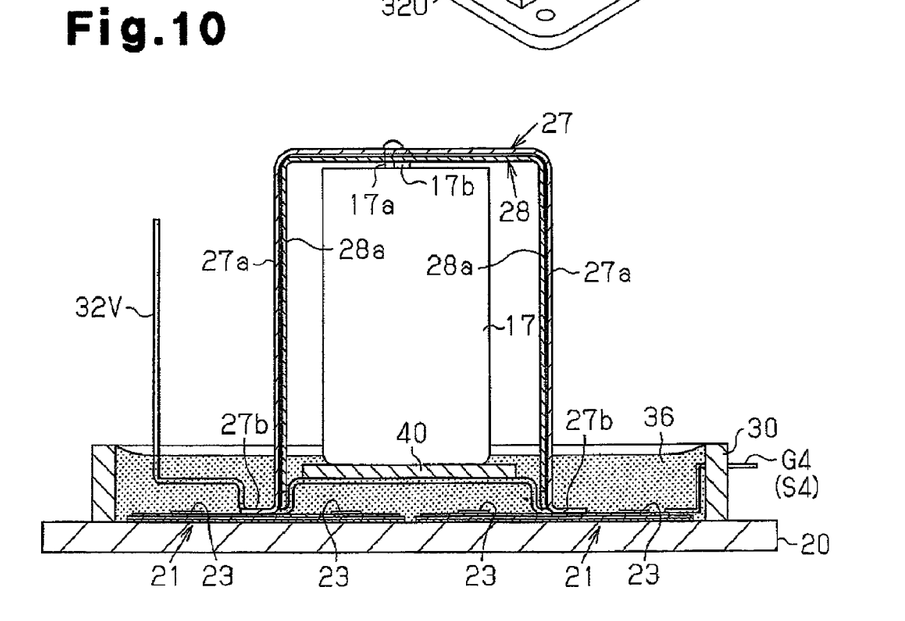
FIG. 10 is a cross-sectional view showing an inverter apparatus, which is a power converter apparatus according to a modification.

The positive interconnection member 27 and the negative interconnection member 28 do not need to be located between the capacitors 17 and the substrate 22. For example, the configuration shown in FIG. 10 may be employed, in which the insulation plate 40 is arranged on the output electrode members 32U, 32V, 32W, while being caused to be perpendicular to the longitudinal direction of the output electrode members 32U, 32V, 32W, and the capacitors 17 are assembled onto the insulation plate 40 with the positive terminals 17a and the negative terminals 17b mounted at portions of the capacitor main body that do not directly face the substrate 22. The positive interconnection member 27 and the negative interconnection member 28 are fixed to the positive terminals 17a and the negative terminals 17b with screws. In this case, as shown in FIG. 10, the lengths of the downward extensions 27c, 28c of the terminal portions 27a, 28a of the positive interconnection member 27 and the negative interconnection member 28 are longer than those in the case where the positive interconnection member 27 and the negative interconnection member 28 are located between the capacitors 17 and the substrate 22. However, compared to the configuration where the capacitors 17 are located outside of the cover, the interconnection inductance is reduced. The position of the cross section of the inverter apparatus 11 shown in FIG. 10 is different from that of FIG. 4A.

Instead of forming each arm by two ceramic substrates 21, each arm may be formed by one ceramic substrate 21. This structure eliminates the necessity of the wire bonding to electrically connect the gate signal circuit patterns 24a to each other and the source signal circuit patterns 24d to each other. Also, the number of joints between each drain circuit pattern 24b and the corresponding joint portions 27b of the positive interconnection member 27, and the number of joints between each source circuit pattern 24c and the corresponding joint portions 28b of the negative interconnection member 28 each may be reduced from two to one. Further, the number of joints between each drain circuit pattern 24b and the corresponding joint portions 35 of the output electrode members 32U, 32V, 32W, and the number of joints between each source circuit pattern 24c and the corresponding joint portions 35 of the output electrode members 32U, 32V, 32W each may be reduced from two to one. However, if the number of each joint is one, a jig for holding the capacitor assembly 38 and a jig for holding the output electrode members 32U, 32V, 32W are needed when performing ultrasonic bonding.

To be maintained in an upright state, each of the output electrode members 32U, 32V, 32W needs at least three joint portions 35.

The circuit patterns 24a, 24b, 24c, 24d do not necessarily have to be formed thin and parallel with each other. However, in the case where the circuit patterns 24b, 24c are shaped like blocks, it is possible to enlarge the area of each ceramic substrate 21 required to secure a sufficient space for mounting a plurality of semiconductor chips 23 on the circuit patterns 24b, 24c and for joining the joint portions 27b, 28b of the positive and negative interconnection members 27, 28 and the joint portions 35 of the output electrode members 32U, 32V, 32W. If the space between the circuit patterns 24b, 24c is narrow, it is difficult to join the joint portions 35 by ultrasonic bonding while maintaining the output electrode members 32U, 32V, 32W in an upright state.

Instead of forming one arm on each ceramic substrate 21, two or more arms may be formed on each ceramic substrate 21.

The metal baseplate 20 may be formed of aluminum-based metal, and the ceramic substrates 21 may be DBA (Direct Brazed Aluminum) substrates, which has an aluminum layer on each side. In this case, the circuit patterns 24a, 24b, 24c, 24d may be formed on the front surface of the DBA substrate, and the back surface of the DBA substrate may be brazed to the metal baseplate 20 with aluminum-based brazing filler metal.

In place of the ceramic substrates 21, metal substrates with insulation layer on the surface may be used as insulated substrates. In this case, the circuit patterns 24a, 24b, 24c, 24d may be formed on the insulation layer.

Instead of joining insulated substrates to the metal baseplate 20 by soldering or brazing, an insulation layer may be formed on the metal baseplate 20, and the circuit patterns 24a, 24b, 24c, 24d may be formed on the insulation layer. In this case, the number of components is reduced, and the step for joining the insulated substrates to the metal baseplate 20 is unnecessary.

The number of the capacitors 17 is not limited to four, but may be changed to less or more than four depending on the capacitance of the rated current value of the inverter apparatus 11 and the capacitance of the capacitors.

The capacitors 17 are not limited to electrolytic capacitors, but may be, for example, electric double-layer capacitors.

The switching elements Q, Q1 to Q6 are not limited to MOSFETs, but may be other types of power transistors, such as IGBTs (Insulated-Gate Bipolar Transistors), or thyristors.

The number of pairs of the switching elements Q and the diode D in each arm is not limited to four, but may be less or more than four depending on the amount current through the arm. Alternatively, each arm may be formed by a single switching element Q and a single diode D.

The single pair of the switching element and the diode does not need to be packaged as one semiconductor chip 23, but may be independently mounted on the circuit.

Instead of three-phase AC, the inverter apparatus 11 may output single phase AC. In such a case, two pairs of upper arms and lower arms are provided.

The power converter apparatus does not need to be the inverter apparatus 11, but may be a DC-DC converter.

The time at which the first ends of the drive signal input terminals G1 to G6 are joined to the circuit patterns 24a and the first ends of the signal terminals S1 to S6 are joined to the circuit patterns 24d is not limited to a time before the capacitor assembly 38 is joined to the ceramic substrates 21 by ultrasonic bonding, but may be changed as long as it is after the support frame 30 is fixed to the metal baseplate 20 and before the support frame 30 is filled with silicone gel.

The juncture between the positive terminal 17a of the capacitor 17 and the positive interconnection member 27 the juncture between the negative terminal 17b and the negative interconnection member 28 are not limited to fastening by screws, but may be achieved by a joining method in which the capacitors 17 are less affected by heat than in soldering. For example, precision resistance welding or laser beam welding may be employed.

What is claimed:

1. A power converter apparatus comprising:
    a substrate on which a plurality of switching elements are mounted;
    a plate-like positive interconnection member and a plate-like negative interconnection member, which are arranged to be close to and parallel with each other and are arranged to be parallel with the substrate, while being electrically insulated from each other;
    a capacitor having a positive terminal electrically connected to the positive interconnection member and a negative terminal electrically connected to the negative interconnection member wherein the positive and negative terminals are located on the same side as the capacitor, and
    a cover arranged over the substrate to encompass the switching elements, the positive interconnection member, the negative interconnection member, and the capacitor,
    wherein the positive interconnection member and the negative interconnection member each have one or more terminal portions that is joined to a circuit pattern on the substrate by ultrasonic bonding,
    wherein the capacitor is arranged on one of the positive and negative interconnection members that does not directly face the substrate.

2. The power converter apparatus according claim 1, wherein the substrate includes a metal baseplate and a plurality of insulated substrate joined onto the metal baseplate, and wherein each insulated substrate includes an insulation layer facing the metal baseplate and the circuit pattern formed on the insulation layer.

3. The power converter apparatus according to claim 1, wherein the positive and negative terminals are provided on the capacitor so as to face the interconnection member on which the capacitor is arranged.

4. The power converter apparatus according to claim 1, wherein the positive interconnection member and the negative interconnection member each having two or more of the terminal portions extending from at least one end of the interconnection member in the widthwise direction, and the distal ends of the terminal portions are bent to extend parallel with the substrate, thereby forming joint portions, the joint portions are joined to the circuit patterns by ultrasonic bonding, and wherein the joint portions of the terminal portions of the positive interconnection member and the joint portions of the terminal portions of the negative interconnection member that are arranged on the same side of the positive and negative interconnection members in the widthwise direction are located on a single straight line.

5. The power converter apparatus according to claim 4, wherein the power converter apparatus is a multi-phase inverter apparatus, the inverter apparatus having output electrode members of a plurality of phases, and wherein each output electrode member extends between the interconnection members and the substrate so as to intersect the interconnection members, each output electrode member having a joint portion to be joined to the substrate by ultrasonic bonding, and wherein the joint portions of the output electrode members are located on the single straight line on which the joint portions of the terminal portions are located.

6. The power converter apparatus according to claim 5, wherein the positive inter connection member and the negative interconnection member each have two or more of the terminal portions on both ends of the positive interconnection member and the negative interconnection member in the widthwise direction, and wherein the terminal portions are arranged to be symmetric with respect to a line extending along the center in the widthwise direction of the positive and negative interconnection members.

* * * * *